(12) United States Patent
Branch et al.

(10) Patent No.: US 7,495,515 B1
(45) Date of Patent: Feb. 24, 2009

(54) LOW-NOISE AMPLIFIER

(75) Inventors: Jason H. Branch, Austin, TX (US); Lawrence E. Connell, Naperville, IL (US); Patrick L. Rakers, Kildeer, IL (US); Poojan A. Wagh, Sleepy Hollow, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 24 days.

(21) Appl. No.: 11/895,427

(22) Filed: Aug. 24, 2007

(51) Int. Cl.
    *H03F 3/04* (2006.01)
(52) U.S. Cl. ........................... 330/305; 330/302
(58) Field of Classification Search ............... 330/305, 330/253, 51, 302
    See application file for complete search history.

(56) References Cited

U.S. PATENT DOCUMENTS

| 6,972,625 | B2 | 12/2005 | Nguyen et al. | |
|---|---|---|---|---|
| 2002/0084855 | A1* | 7/2002 | Kwon et al. | ................ 330/311 |
| 2004/0080372 | A1* | 4/2004 | Chen | ......................... 330/311 |
| 2004/0219900 | A1 | 11/2004 | Zheng et al. | |
| 2006/0238251 | A1* | 10/2006 | Kimura | ..................... 330/253 |
| 2008/0246538 | A1* | 10/2008 | Beffa | ......................... 327/557 |

OTHER PUBLICATIONS

Trung-Kien Nguyen, Chung-Hwan Kim, Gook-Ju Ihm, Moon-Su Yang, Sang-Gug Lee, "CMOS Low-Noise Ampl Desg Optimization Tech", IEEE Trans on Micro Theory & Tech vol. 52 No. 5 May, 2004.
Naveen K. Yanduru, et al., "A WCDMA, GSM/GPRS/EDGE Receiver Front End Without Interstage SAW Filter", Article.
Derek K. Shaeffer and Thomas H. Lee, "A 1.5V, 1.5-GHz CMOS Low Noise Amplifier", IEEE Journal of Solid-State Circuits vol. 32 No. 5 May 1997.

* cited by examiner

*Primary Examiner*—Henry K Choe
(74) *Attorney, Agent, or Firm*—Charles W. Bethards

(57) ABSTRACT

Methods and corresponding systems in a low noise amplifier include selecting a selected sub-band for amplifying, wherein the selected sub-band is one of a plurality of sub-bands, wherein each sub-band is a portion of a frequency band, and wherein each sub-band has a corresponding sub-band center frequency. Next, a gate-source capacitor is adjusted so that a real part of an LNA input impedance corresponds to a real part of a source impedance at the selected sub-band center frequency. A match capacitor is also adjusted so that the LNA input impedance corresponds to the complex conjugate of the source impedance at the selected sub-band center frequency. The gate-source capacitor and the match capacitor can each be adjusted by recalling capacitor values from memory that correspond to the selected sub-band, and connecting selected capacitor components in response to the recalled capacitor values.

22 Claims, 7 Drawing Sheets

LOW-NOISE AMPLIFIER

BACKGROUND

1. Field

This disclosure relates generally to amplifiers, and more specifically to adjusting an input impedance of an inductively-degenerated low-noise amplifier.

2. Related Art

In the field of communications, a major component in a receiver is the low noise amplifier (LNA), which can be a first amplifier in a series of amplifiers that are used to demodulate and process a low-level signal received by an antenna. A good LNA amplifies extremely low-power signals without adding excessive noise, thus preserving the required signal-to-noise ratio (SNR) of the system at extremely low power levels. Additionally, the LNA amplifies the received signal without introducing significant distortion.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

An LNA is an electronic amplifier, which can be used e.g., in communication systems to amplify low power signals, such as wireless signals captured by an antenna. The LNA has an impact on the quality and capabilities of a receiver because the effective noise of all the subsequent stages is reduced by the gain of the LNA, and the noise of the LNA is injected directly into the received signal.

Figure 1:
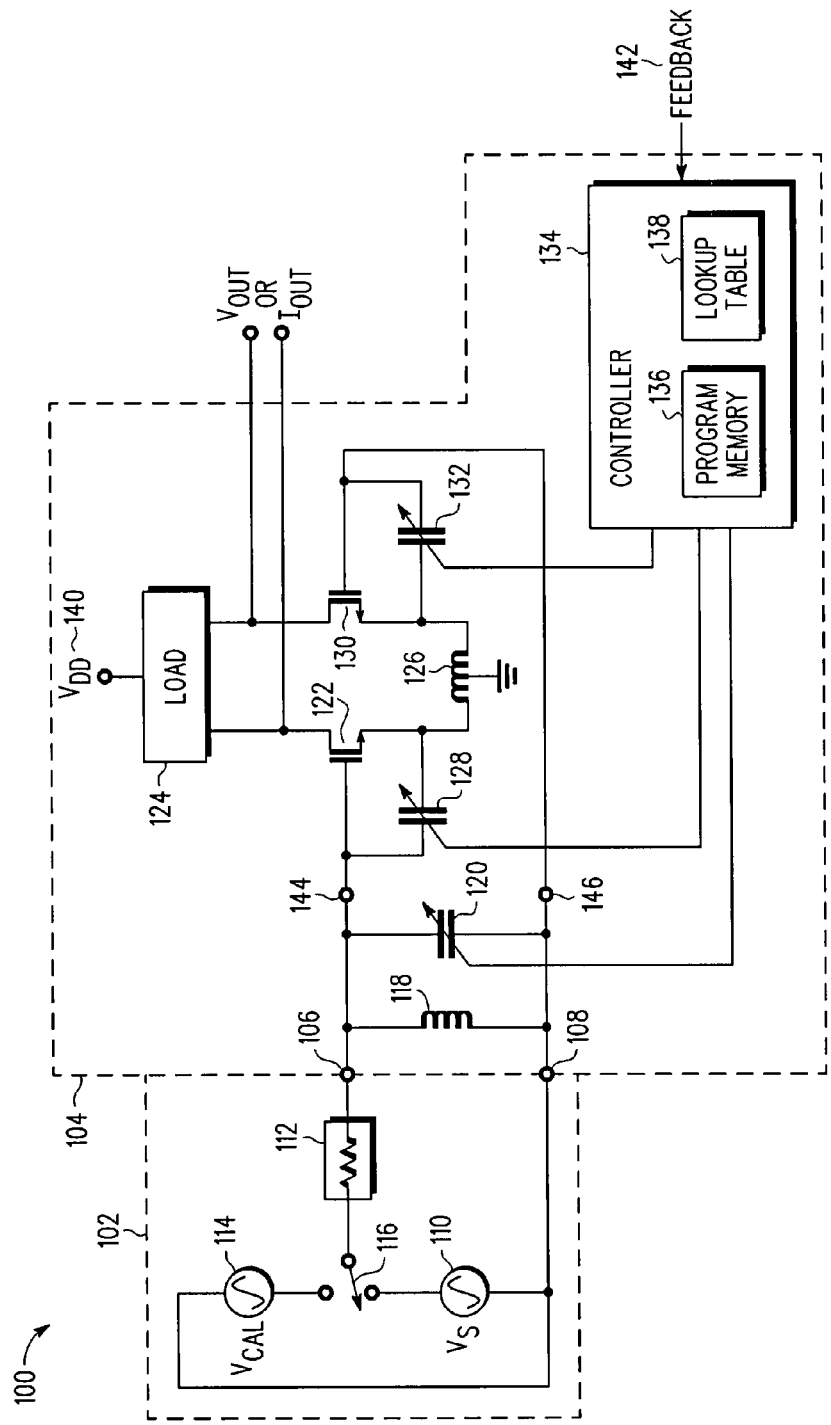
FIG. 1 is a high-level block diagram of a low noise amplifier (LNA) system having an LNA input coupled to a source in accordance with one or more embodiments.

FIG. 1 is a high-level block diagram of a low noise amplifier (LNA) system in accordance with one or more embodiments. As illustrated, LNA system 100 includes a source 102 coupled to an LNA 104 at first and second terminals 106 and 108, respectively. Source 102 provides a low-power signal to the LNA for amplification. Source 102 includes signal source 110 and source impedance 112. Source impedance 112 can be a resistance, as illustrated with dashed lines in FIG. 1. In other embodiments, source impedance 112 can be complex, including both real (e.g., resistive) and imaginary (e.g., reactive) parts.

In one embodiment, source 102 can include signal source 110 and calibration source 114, which can be selectively coupled through switch 116 and source impedance 112 to first terminal 106. Signal source 110 can be implemented with an antenna coupled to a transmission line, wherein a low-power signal can be received from a wireless source (e.g., a cell phone tower, a wireless network access point, a satellite antenna, or the like). In other embodiments, signal source 110 can be a wireline source, wherein a low-power signal can be received from a fiber optic cable, telephone cable, coaxial cable, or the like.

Whether source 102 is wireless or wireline, a matching network (not shown) can be included in source 102 (e.g., between the antenna and the transmission line) to produce a predetermined source impedance 112. Thus, impedance 112 can represent the impedance of source 102.

Calibration source 114 can, in some embodiments, be implemented with a low-power signal generator, which, for example, can output a selected waveform at a selected frequency (e.g., a radio frequency signal) in order to simulate signals that may be output by signal source 110. The output from calibration source 114 can be used to calibrate LNA 104, and also as a means to more comprehensively calibrate a receiver by allowing a controlled RF signal to bypass the antenna. The RF signal can be used to determine settings used by controller 134 that tune an input matching network to a particular frequency band and/or frequency sub-band. The calibration source 114 can also be used to measure the performance of LNA 104, and also the performance of the receiver in which LNA 104 is used.

In some embodiments, the low-level signal provided by calibration source 114 can be demodulated and measured at the output of a receiver that incorporates LNA 104 (other than LNA 104, the receiver is not shown). This low-level signal can be used to determine the LNA 104 performance for a particular frequency band or sub-band based on the settings of adjustable match capacitor 120, and adjustable gate-source capacitors 128 and 132. The settings for adjustable match capacitor 120, and adjustable gate-source capacitors 128 and 132 can then be programmed, or adjusted, in lookup table 138 in controller 134, as described in more detail below. Feedback 142 can be produced from performance metrics and/or measurements taken either at the output of LNA 104, or elsewhere in a receiver that uses LNA 104. Feedback 142 can then be used to calibrate or otherwise adjust the settings for adjustable match capacitor 120, and adjustable gate-source capacitors 128 and 132.

Switch 116 can be used to select an output from signal source 110 or calibration source 114. Switch 116 can be any one of several known switch types for switching a low-power analog signal source such as, for example, an analog single-throw switch that can toggle between the antenna and calibration source 114. Switch 116 can be controlled by a signal from controller 134, discussed in more detail below.

In one embodiment, LNA 104 can include match inductor 118 and adjustable match capacitor 120 connected in parallel across first and second LNA input terminals 106 and 108. First transistor 122, which, in the embodiment shown, is a N-channel transistor (e.g., a transistor having a first or one conductivity type of a transistor), can have a first or one current electrode (e.g., a source electrode), and a second or another current electrode (e.g., a drain electrode), and a control electrode (e.g., a gate electrode). The gate electrode can be coupled to the first LNA input terminal 106, and the drain electrode can be coupled to load 124. The source electrode of first transistor 122 can be connected to a first terminal of source inductor 126. A center tap of source inductor 126 can be connected to ground or a virtual ground. An adjustable gate-source capacitor 128 can be coupled between the gate electrode and the source electrode of first transistor 122.

A second N-channel transistor 130 can have a drain electrode coupled to load 124, a source electrode coupled to a second terminal of source inductor 126, and a gate electrode coupled to second LNA input terminal 108. An adjustable gate-source capacitor 132 can be coupled between the gate electrode and the source electrode of second transistor 130. In the embodiment of FIG. 1, transistors 122 and 130 are configured as a differential, common-source amplifier, wherein transistors 122 and 130 have similar characteristics (e.g., they are matched transistors).

In various embodiments, load 124 can be implemented with a high impedance load, such as a current source, or an inductor, depending upon what is needed to match a subsequent circuit, such as a mixer or amplifier stage, connected to the output (e.g., the drain terminals of first and second transistors 122 and 130) of LNA 104. If the output of LNA 104 is coupled to a low input impedance mixer or amplifier (not shown), the output of LNA 104 can be a current. Alternatively, if such a coupled mixer or amplifier has a high input impedance, the output of LNA 104 can be a voltage. Load 124 can be connected to voltage reference $V_{DD}$ 140. Whether outputting a current or a voltage, the output of LNA 104 is taken across the drain terminals of first transistor 122 and second transistor 130.

In an LNA embodiment having a voltage output, load 124 can be implemented with two inductors. The inductors offer a positive reactance at RF frequencies to match, for example, a mixer, amplifier, or parasitic capacitance coupled to the output of LNA 104 (not shown) that has a negative reactance. The equal and opposite reactances will have a high impedance at the desired radio frequency. A common source amplifier with a high impedance load creates a voltage output.

In another embodiment having a current output, load 124 can be implemented with two positive-channel field effect transistors (PFET's), which can be used to create high impedance current sources, which can be coupled to a mixer or amplifier presenting a low input impedance. In other embodiments, load 124 can be implemented with two inductors, which can be used as RF chokes having a high impedance at radio frequency. Such inductors can be coupled to a mixer or amplifier presenting a low input impedance. Thus, in embodiments having a common source amplifier with either type of high impedance load coupled to a low impedance mixer or amplifier, a current output can be produced.

LNA 104 can include controller 134 for adjusting or setting adjustable capacitors 120, 128, and 132, or for controlling source selection switch 116. Controller 134 can include program memory 136 for storing and recalling software instructions and parameters (e.g., software, microcode, firmware, or the like) used to operate controller 134. Controller 134 can also include lookup table 138, which can be used to store and recall data records that relate adjustable capacitor settings to input frequencies (e.g., input signal center frequencies or ranges of frequencies) that can be amplified in LNA 104. Controller 134 is coupled to adjustable match capacitor 120, adjustable gate-source capacitor 128, and adjustable gate-source capacitor 132 for the purpose of controlling the capacitance values of these adjustable capacitors. In one embodiment, the control signals from controller 134 represent binary data bits that correspond to respective capacitance values.

In the embodiment shown in FIG. 1, LNA 104 has an inductive-degeneration configuration, which has an inductor (e.g., $L_S$ 126) connected to the source of a transistor (e.g., transistor 122, 130) operating in the saturation region. In an equivalent small-signal analysis, looking from terminals 144 and 146 (see FIGS. 1, 2, 6, and 7) into the gate(s) of one or more transistors (e.g., transistors 122 and 130), source inductor 126 can create both a real and a reactive impedance at the gate of the transistors. The real part is given by Equation 1, below:

$$\text{Real}(Z_{SRC}) = gm * \frac{L_S}{C_{GS,T}} \qquad \text{Equation 1}$$

where gm is the transistor (i.e., MOSFET) transconductance, and $C_{GS,T}$ is the total capacitance across the gate and source terminals of either transistor 122 or transistor 130 (e.g., the parallel combination of adjustable gate-source capacitor 128, 132 in parallel with the gate-source capacitance of transistor 122, 130). The imaginary part is given by Equation 2, below:

$$\text{Imag}(Z_{SRC}) = \omega * L_S - \frac{2}{\omega * C_{GS,T}} \qquad \text{Equation 2}$$

where ω is the angular frequency. As is known, in an inductively-degenerated low-noise amplifier, the inductor adds very little noise to the amplifier, and it also provides a real impedance at the transistor gate, which can be used for input matching.

Figure 2:
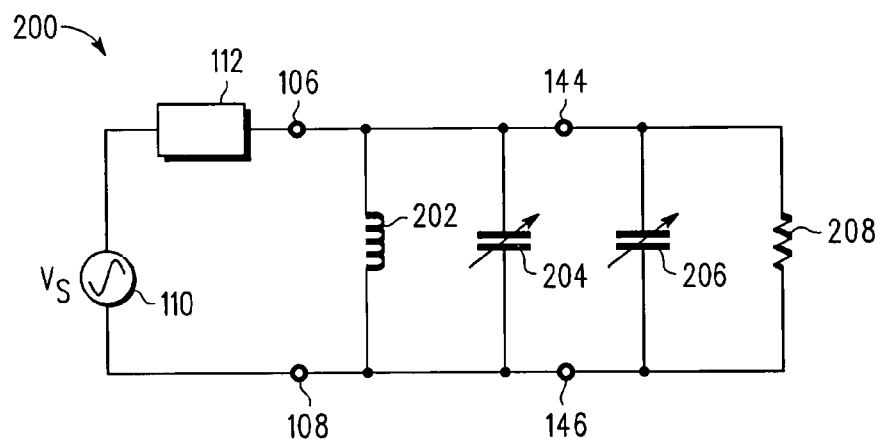
FIG. 2 is a high-level schematic diagram of a model of an input impedance of the LNA of FIG. 1 in accordance with one or more embodiments.

FIG. 2 shows a high-level schematic diagram of a model of an input impedance of LNA 104 in accordance with one or more embodiments. As illustrated, signal source 110, which has a source impedance 112, is coupled to the LNA input impedance model at first and second terminals 106 and 108. Signal source 110 can be an antenna and an associated matching network, which in combination have an output impedance equivalent to source impedance 112. The input impedance of LNA 104 can be modeled as a parallel equivalent circuit that includes inductor 202 in parallel with adjustable capacitor 204, which in turn are in parallel with adjustable capacitor 206 and resistor 208. The value of adjustable capacitor 204 can be equal to the value of adjustable match capacitor 120 (see FIG. 1). Assuming that the input reactance of LNA 104 is dominated by capacitance, the value of resistor 208 (i.e., $R_{208}$), which is the parallel equivalent resistance of LNA 104, can be determined from Equation 3, below:

$$R_{208} = \frac{(g_m * L_S)}{(C_{GS,T})} + \frac{4}{(\omega^2 * C_{GS,T} * L_S * g_m)} \qquad \text{Equation 3}$$

where $g_m$ is the transconductance of the transistor, ω is the center frequency of the source signal, $C_{GS,T}$ is the total capacitance across the gate and source terminals of either transistor 122 or transistor 130 (e.g., the parallel combination of adjustable gate-source capacitor 128, 132 in parallel with the gate-source capacitance of transistor 122, 130), $L_S$ is the total inductance of source inductor 126.

The value of adjustable capacitor 206, again assuming the input reactance of LNA 104 is dominated by capacitance, can be described by Equation 4, below:

$$C_{206} = \frac{C_{GS,T}/2}{1 + (\omega * g_m * L_S/2)^2} \qquad \text{Equation 4}$$

To obtain maximum power transfer from a source to a load, the source impedance should equal the complex conjugate of the load impedance. That is, the source should be conjugately matched to the load. This can be expressed mathematically, in terms of admittance and susceptance, as shown in Equation 5, below:

$$Y_S + jB_S = Y_L - jB_L \qquad \text{Equation 5}$$

In addition, for efficient power transfer, this conjugately matched condition is required to avoid the reflection of energy from the load back to the source (e.g., the rejection of an input signal outside a sub-band). This is particularly true for high-frequency systems, like radio frequency (RF) and microwave systems, video systems, and the like.

Thus, the input matching network of LNA 104, which can be considered the load for signal source 102, can be set so that:

$$R_{208} = \frac{1}{Y_s} \qquad \text{Equation 6}$$

$$1/(j*w*L_{202}) + j*w*C_{206} + j*w*C_{204} = -j*B_s \qquad \text{Equation 7}$$

Figure 3:
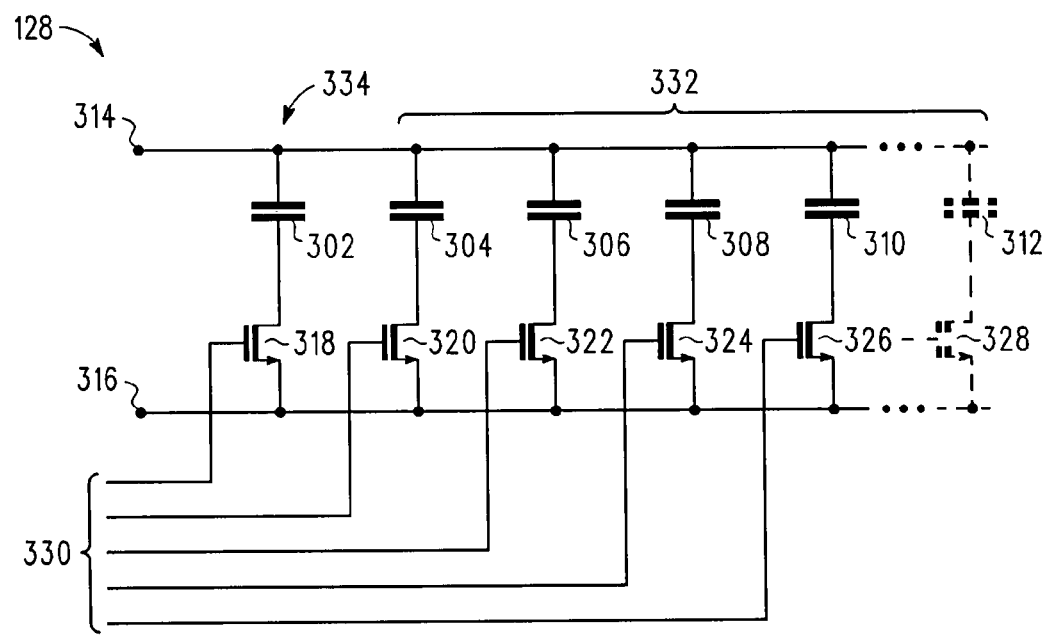
FIG. 3 depicts an adjustable gate-source capacitor circuit in accordance with one or more embodiments.

FIG. 3 depicts an adjustable gate-source capacitor that can be used in an LNA circuit as gate-source capacitor 128 or 132 (see FIG. 1) in accordance with one or more embodiments. As shown, a plurality of gate-source capacitor components 302, 304, 306, 308, 310, and 312, have a first terminal coupled to a first gate-source capacitor terminal 314. In one embodiment, gate-source capacitor components 302, 304, 306, 308, 310, and 312 can be implemented with metal-insulator-metal (MIM) capacitors, which capacitors can be built into integrated circuits using integrated circuit fabrication techniques. Gate-source capacitor component 312 is shown with dashed lines because there can be any number of gate-source capacitor components. These gate-source capacitor components can be selectively coupled to a second gate-source capacitor terminal 316 by switches connected in series with each gate-source capacitor component. Such switches can be implemented with transistors, such as transistors 318, 320, 322, 324, 326, and 328. These transistors can each have a drain electrode coupled to a second terminal of the gate-source capacitor component, a source electrode coupled to the second gate-source capacitor terminal 316, and a gate electrode coupled to a control signal 330, which control signals can be provided by controller 134 in FIG. 1.

In one embodiment, the capacitance value of adjustable gate-source capacitor 128 or 132 can be provided across first and second gate-source capacitor terminals 314 and 316. The capacitance value is adjusted by selecting one or more gate-source capacitor components from the plurality of gate-source capacitor components, and then connecting the selected combination of gate-source capacitor components across first and second gate-source capacitor terminals 314 and 316. In the embodiment shown in FIG. 3, a control signal on the gate of the transistor will connect the selected gate-source capacitor components, which will all be added together to produce the adjustable gate-source capacitance (e.g., capacitance 128 or 132 in FIG. 1).

In another embodiment, the switches used for selectively connecting gate-source capacitor components can be implemented with so-called analog switches, which are electronic components that behave in a way similar to a relay. The switching element of an analog switch can be a transistor, such as a metal-oxide-semiconductor field-effect transistor (MOSFET), which is controlled by standard logic-level input.

In another embodiment, microelectromechanical systems (MEMS) can be used to provide relays to selectively connect gate-source capacitor components (e.g., 302, 304, 306, 308, 310, and 312) to gate-source capacitor terminals 314 and 316. MEMS are very small mechanical devices, which are often fabricated using modified semiconductor fabrication technology, such as molding and plating, wet and dry etching, electro discharge machining, and other technologies capable of manufacturing very small devices.

In some embodiments, gate-source capacitor components can be grouped into capacitor components associated with the selection of a sub-band and capacitor components associated with the selection of a frequency band. For example, gate-source capacitor components 332 can be used to select a sub-band for amplifying in LNA 104, while gate-source capacitor component 334 may be used to select a frequency band for amplifying. In one embodiment, gate-source capacitor components 332 can be binary-weighted values (e.g., each gate-source capacitor component value is two times the value of the next smaller value) so the various gate-source capacitance values in a range of values can be formed. Gate-source capacitor component 334 (and any other capacitor components in the group for selecting a frequency band) can be selected in order to select a frequency band that is not contiguous with frequency sub-bands that can be selected using gate-source capacitor components 332. As an example, gate-source capacitor component 334 can be switched in and out in order to select frequency bands that are not contiguous, and that are associated with different telecommunications standards.

Figure 4:
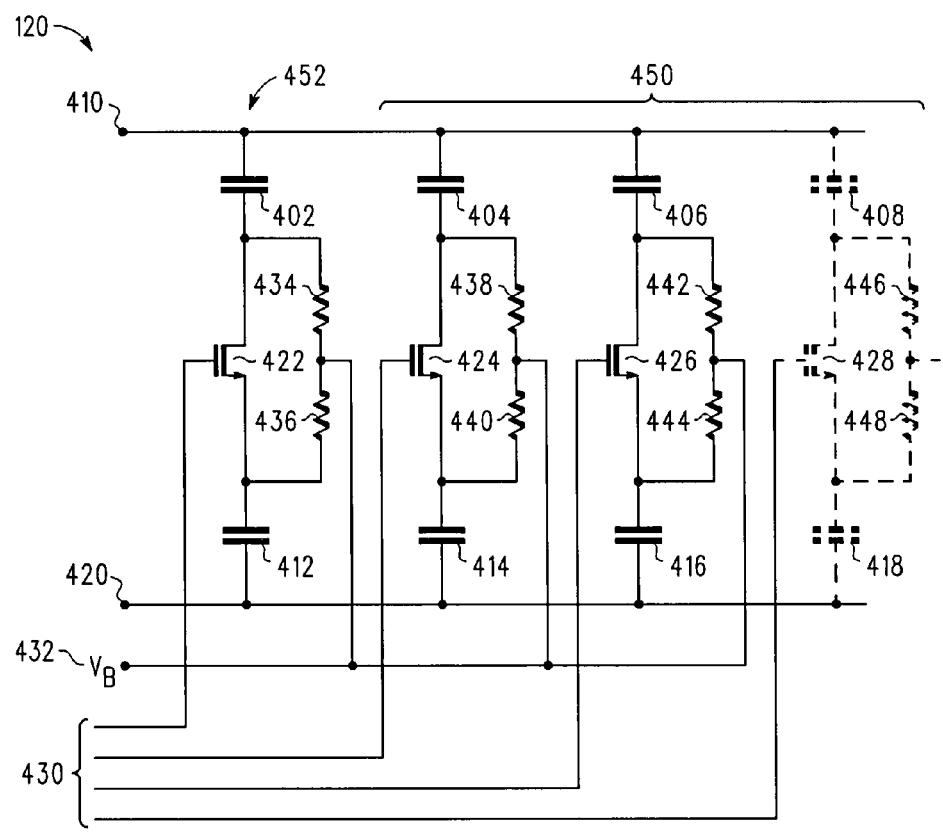
FIG. 4 depicts an adjustable match capacitor circuit in accordance with one or more embodiments.

FIG. 4 depicts an adjustable match capacitor that can be used in an LNA circuit as adjustable match capacitor 120 (see FIG. 1) in accordance with one or more embodiments. As shown, a plurality of first match capacitor components 402, 404, 406, and 408 have a first terminal coupled to a first match capacitor terminal 410, and a plurality of second match capacitor components 412, 414, 416, and 418 have a second terminal coupled to a second match capacitor terminal 420. In one embodiment, first match capacitor components 402, 404, 406, and 408, and second match capacitor components 412, 414, 416, and 418 can be implemented with metal-insulator-metal (MIM) capacitors.

These match capacitor components (402-408 and 412-418) can be selectively coupled, in first and second pairs, between first match capacitor terminal 410 and second match capacitor terminal 420 by controlling a switch between the first and second match capacitor components. In one embodiment, the switch can be implemented with a transistor, such as transistors 422, 424, 426, and 428. These transistors can have a drain electrode coupled to a second terminal of the first match capacitor component, a source electrode coupled to a first terminal of the second match capacitor component, and a gate electrode coupled to a control signal 430, which control signal can be provided by controller 134 in FIG. 1. First and second match capacitor components 408 and 418, and transistor 428 (i.e., switch), are shown with dashed lines because there can be any number of match capacitor components.

Thus, in one embodiment, the capacitance value of adjustable match capacitor 120 can be provided across first and second match capacitor terminals 410 and 420. The capacitance value is adjusted by selecting one or more match capacitor components (e.g., match capacitor component pairs 402 & 412, 404 & 414, 406 & 416, and 408 & 418) from the plurality of match capacitor components, and then connecting the selected combination of match capacitor components across first and second match capacitor terminals 410 and 420. In the embodiment shown in FIG. 4, a high-level signal on the gate of the transistor will connect the selected pair of first and second match capacitor components, wherein the selected pairs will all be added together to produce the adjustable match capacitance (e.g., capacitance 120 in FIG. 1).

To provide bias voltages to transistors 422, 424, 426, and 428, pairs of resistors can be connected to bias voltage $V_B$ 432 and to the drain and source of the transistors. For example, as shown in FIG. 4, first bias resistor 434 and second bias resistor 436 can provide bias voltages for transistor 422, first bias resistor 438 and second bias resistor 440 can provide bias voltages for transistor 424, first bias resistor 442 and second bias resistor 444 can provide bias voltages for transistor 426, and first bias resistor 446 and second bias resistor 448 can provide bias voltages for transistor 428. Note that if the switches for connecting match capacitor components do not need a bias voltage, resistors 434-448 are not needed. An example of switches that do not need a bias voltage are MEMS switches, which are discussed above.

Another alternative for implementing an adjustable capacitor (e.g., an adjustable gate-source capacitor 128, 132, or an adjustable match capacitor 120) is a voltage variable capacitor, or a varactor. A varactor is a reverse-biased diode. The capacitance of the diode can be changed by adjusting a DC bias voltage across the diode. A voltage variable capacitor can be implemented with a MOSFET, wherein the gate is one terminal of the capacitor, the drain and source terminals are shorted together, and together they comprise the second terminal of the capacitor. The capacitance of a voltage variable capacitor can be adjusted by driving an array of voltage variable capacitors with a multitude of binary signals to create an assortment of capacitances, or it can be driven by an analog bias voltage to produce a continuous range of capacitance values.

As with the grouping of capacitors in FIG. 3, in some embodiments, pairs of match capacitor components in FIG. 4 can be grouped into capacitor components associated with the selection of a sub-band, and capacitor components associated with the selection of a frequency band. For example, pairs of match capacitor components 450 can be used to select a sub-band for amplifying in LNA 104, while match capacitor component 452 may be used to select a frequency band for amplifying. In one embodiment, match capacitor components 450 can have binary-weighted values (e.g., each match capacitor component value is two times the value of the next smaller value) so the various match capacitance values in a range of values can be formed. Match capacitor component 452 (and any other capacitor components in the group for selecting a frequency band) can be selected in order to select a frequency band that is not contiguous with frequency sub-bands that can be selected using match capacitor components 450. As an example, match capacitor component 452 can be switched in and out in order to select frequency bands that are not contiguous, and that are associated with different telecommunications standards.

In the operation of LNA system 100, components of LNA 104 can be tuned or adjusted so that the input impedance of LNA 104 conjugately matches the output impedance of source 102. As shown in the embodiment of FIG. 1, adjustable match capacitor 120 and adjustable gate-source capacitors 128 and 132 are coupled to control signals provided by controller 134, wherein the control signals can tune or adjust capacitance values.

Figure 8:
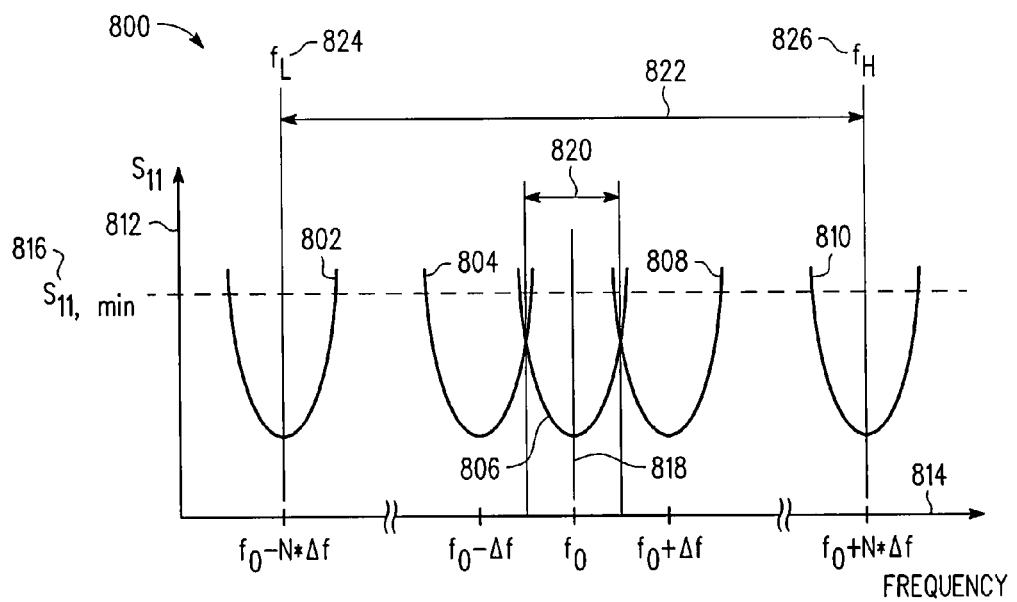
FIG. 8 is a graph of frequency versus input reflection coefficient curves corresponding to a plurality of sub-bands within a frequency band in accordance with one or more embodiments.

In one embodiment, the coupling of source 102 to LNA 104 can have an input reflection coefficient curve, which can be commonly referred to as an $S_{11}$ curve, that shows energy passes from source 102 to LNA 104 in a narrow band of frequencies (e.g., a sub-band of frequencies), and energy is reflected or rejected in all other frequencies. FIG. 8 shows a plurality of $S_{11}$ curves 802, 804, 806, 808, and 810, wherein $S_{11}$ values 812 are plotted against signal frequency 814 for selected settings of adjustable match capacitor 120 and adjustable gate-source capacitors 128 and 132. As shown in FIG. 8, LNA 104 can have an $S_{11}$ curve, such as curve 806, that has values less than a desired minimum $S_{11}$ value (e.g., $S_{11,min}$ 816) over a sub-band of frequencies 820 within a frequency band 822, which band extends from a low frequency, $f_L$ 824, to a high frequency, $f_H$ 826. Such a frequency band 822 can be a range of frequencies (e.g., ranging from $f_L$ to $f_H$) that contains adjacent channels or frequencies that a communication device can receive according to a communications standard promulgated by a government body or industry association. Examples of such frequency bands include the frequency bands set forth in specifications published by the $3^{rd}$ Generation Partnership Project (3GPP), or specifications published by American National Standards Institute (ANSI), or standards published by the Telecommunications Industry Association (TIA), or other similar standards. A sub-band 820 can be defined as a portion of a frequency band 822 wherein frequency band 822 contains two or more sub-bands 820. Note that the LNA input can be modeled, from the perspective of terminals 106 and 108, as an equivalent RLC circuit, such as shown in FIG. 2, and that the equivalent circuit, as well as LNA 104, has a Q factor, wherein the Q factor of the LNA input has a value greater than a Q factor needed to receive the entire frequency band 822 with less than a predetermined input reflection coefficient (e.g., $S_{11,min}$ 816 shown in FIG. 8).

Thus, FIG. 8 shows a plurality of sub-bands 820 within a frequency band 822, wherein each sub-band is associated with an $S_{11}$ curve 802, 804, 806, 808, and 810, and each sub-band has a corresponding sub-band center frequency, such as sub-band center frequency $f_0$ 818 that corresponds to sub-band 820. Each sub-band can be spaced apart from an adjacent sub-band so that adjacent $S_{11}$ curves intersect at points below $S_{11,min}$ 816 in order to ensure that LNA 104 can receive all frequencies in the frequency band 822 by the appropriate selection of a sub-band. Thus, by using the selection of sub-bands, LNA 104 can be considered a wideband amplifier capable of amplifying signals over a frequency band 822, and perhaps over two or more selectable frequency bands (note that only one frequency band 822 is shown in FIG. 8). The width of each $S_{11}$ curve is determined by the quality factor (i.e., the Q factor) of the equivalent parallel RLC circuit (i.e., resistance-inductance-capacitance resonant circuit) in FIG. 2. The quality factor depends on the amount of loss each component adds to the equivalent RLC circuit. The quality factor of each component can ensure that the minimum $S_{11}$ values are met over a frequency band or frequency sub-band.

In some embodiments, a sub-band 820 can include more than one frequency channel, wherein the frequency channel is defined according to the relevant specification. In another embodiment, a sub-band may include a single channel. As a general principle, the width of the $S_{11}$ curve that defines the sub-band 820 is set to receive one or more channels as defined by the specification, and the curve is designed to overlap adjacent $S_{11}$ curves so that all channels in the frequency band can be amplified, which means that the LNA is able to reflect or reject energy outside the desired frequency range, thereby increasing the selectivity of the amplifier and reducing the noise in the amplifier.

Figure 5:
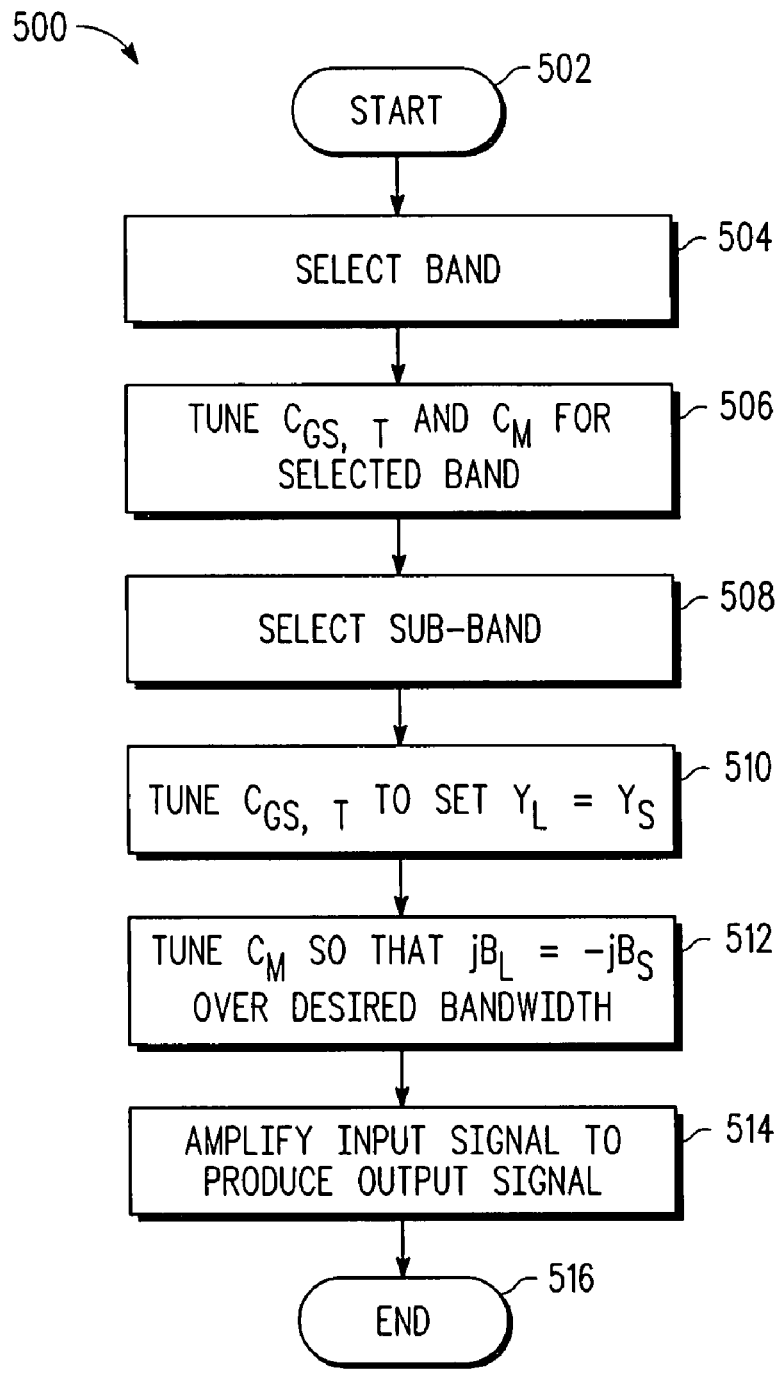
FIG. 5 is a high-level flowchart depicting a process that can be executed in an LNA in accordance with one or more embodiments.

FIG. 5 shows high-level flowchart 500 depicting a process that can be executed in LNA 104 in accordance with one or more embodiments. As illustrated, flowchart 500 begins at 502, and thereafter passes to 504 wherein the process selects a frequency band for amplifying in the LNA. The frequency band can be a range of frequencies selected in accordance with a communications standard, wherein the frequency band includes a set of adjacent frequencies or channels for receiving a signal. Typically such frequency bands are discontinuous ranges of frequencies, wherein such frequency bands are separated by a range of frequencies. In one embodiment, the frequency band can be selected based upon a user input (e.g., activated by a keyboard or button input, are activated by voice command inputs, or the like), or selected based upon the availability of a communication network (e.g., in response to signal strength measurements of base stations signals, or the like), or based on instructions from a communications system controller (e.g., instructions from a base station, or the like).

After selecting the frequency band, the process can tune or adjust one or more adjustable gate-source capacitors, and tune or adjust an adjustable match capacitor, for the selected frequency band, as illustrated at 506. In one embodiment, tuning the one or more adjustable gate-source capacitors can be implemented with appropriate control signals from controller 134 (see FIG. 1), wherein the signals (see signals 330 in FIG. 3) are used to tune or adjust gate-source capacitors 128 and 132, wherein the adjustable gate-source capacitors can be implemented according to the configuration shown and FIG. 3. Adjusting gate-source capacitors for a selected frequency band can include switching gate-source capacitor component 334, which changes the gate-source capacitor for tuning to a discontinuous frequency band. The value of the gate-source capacitors can be calculated according to Equations 3 and 6, above.

Similarly, tuning the adjustable match capacitor can be implemented using control signals 430 from controller 134 to tune or adjust adjustable match capacitor 120. Adjusting the match capacitor for a selected frequency band can include switching gate-source capacitor component 452, which changes the match capacitor for tuning to a discontinuous frequency band. The value of the match capacitor can be calculated according to Equations 4 and 7, above. Under the control of instructions stored in program memory 136, controller 134 can recall settings for the adjustable capacitors from lookup table 138, wherein the recalled settings correspond to the selected frequency band.

After tuning the adjustable capacitors for the selected frequency band, the process can select a sub-band for amplifying, as depicted at 508. In one embodiment, the sub-band selection can be made according to a communications system standard or protocol (e.g., initially turning to a control channel, or a channel used to request service, or the like), or in response to instructions from a base station or other communication system controller (e.g., instructions for receiving a call or other data, a handoff instruction, or the like). Thus, the selection of a sub-band for amplifying includes selecting a sub-band that contains the desired channel.

Once the sub-band is selected, the process can tune or adjust one or more adjustable gate-source capacitors to set a real part of the load impedance substantially equal to a real part of the source impedance (i.e., set $R_L=R_S$, or using an admittance in a parallel equivalent circuit, set $Y_L=Y_S$) at the selected sub-band center frequency, as depicted at 510. In one embodiment, tuning the one or more adjustable gate-source capacitors can be implemented with appropriate control signals 330 (see FIG. 3) from controller 134 (see FIG. 1), wherein the signals are used to tune or adjust gate-source capacitors 128 and 132. In one embodiment, a combination of binary-weighted gate-source capacitor components 332 can be selected and connected to produce the desired gate-source capacitance value according to data stored in controller 134 for the selected sub-band.

Next, the process can tune or adjust an adjustable match capacitor to set an imaginary part of the load impedance substantially equal to a complex conjugate of the imaginary part of the source impedance (i.e., set $jX_L=-jX_S$, or using a susceptance in a parallel equivalent circuit, set $jB_L=-jB_S$) at the selected sub-band center frequency, as illustrated at 512. In one embodiment, tuning the adjustable match capacitor can be implemented with appropriate control signals 430 (see FIG. 4) from controller 134 (see FIG. 1), wherein the signals are used to tune or adjust match capacitor 120. In one embodiment, a combination of binary-weighted match capacitor components 450 can be selected and connected to produce the desired match capacitance value according to data stored in controller 134 for the selected sub-band.

Finally, the process amplifies the input signal to produce an output signal, as depicted at 514. In one embodiment, the input signal is received from source at terminals 106 and 108 (see FIG. 1), and LNA 104 produces an amplified output signal across the terminals of load 124 (e.g., $V_{OUT}$ or $I_{OUT}$). After producing the amplified output signal, the process in the LNA ends, as shown at 516. Although the process is shown having an end, the process of amplifying at 514 can occur for as long as needed for the selected frequency band and sub-band, and the process of selecting bands and sub-bands can be repeated as necessary for operation of the LNA in a communications system.

Figure 6:
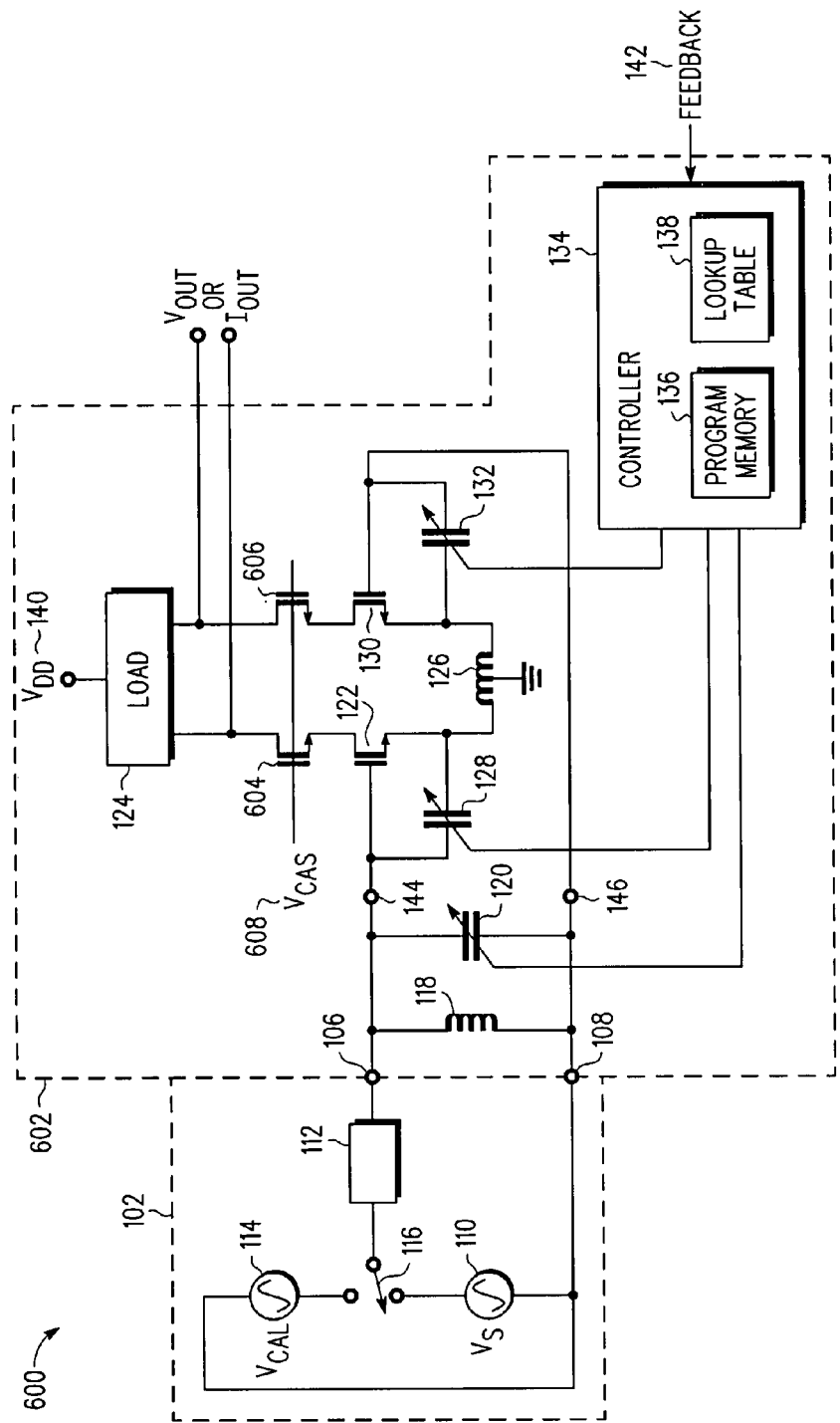
FIG. 6 depicts a high-level block diagram of an LNA system coupled to a source in accordance with one or more embodiments.

FIG. 6 depicts high-level block diagram of an LNA system 600 coupled to a source in accordance with one or more embodiments. As a variation to the common-source configuration of the LNA shown and FIG. 1, the embodiment of FIG. 6 is a cascode implementation of a wide bandwidth inductively-degenerated low-noise amplifier. As shown, LNA system 600 source 102 coupled to LNA 602 at terminals 106 and 108. Where components and FIG. 6 are similar to those illustrated in FIG. 1 the same reference numerals have been used. In the cascode implementation, transistors 604 and 606 have been added, respectively, between transistors 122 and 130 and load 124. The output of amplifier 602 is taken across the drain terminals of transistors 604 and 606 to provide $V_{OUT}$ or $I_{OUT}$ (e.g., an output voltage or an output current). The source terminals of transistors 604 and 606 are connected to respective drain terminals of transistors 122 and 130. The gate terminals of transistors 604 and 606 are connected to $V_{CAS}$ 608, which is a voltage to bias the cascode transistors. The cascode devices improve the isolation between the input of the amplifier and the output of the amplifier, at the expense of requiring more supply headroom than a common-source amplifier.

Figure 7:
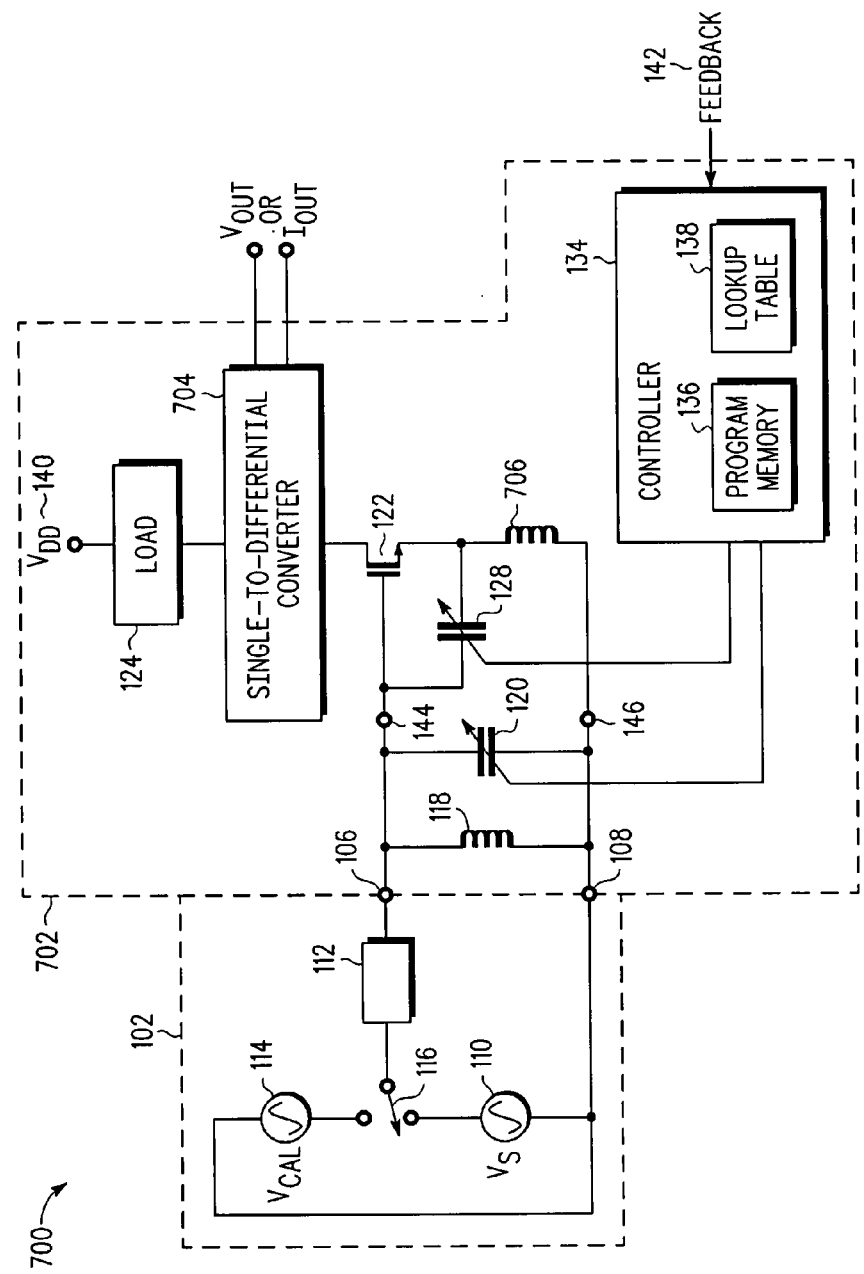
FIG. 7 depicts a high-level block diagram of an LNA system coupled to a source in accordance with one or more embodiments.

FIG. 7 depicts high-level block diagram of an LNA system 700 coupled to a source in accordance with one or more embodiments. FIG. 7 illustrates a single-ended implementation of the differential amplifier in FIG. 1. The principles of matching source 102 to LNA 702 is generally the same as in FIG. 1. In the single-ended embodiment of FIG. 7 the output signal (e.g., $V_{OUT}$ or $I_{OUT}$) is converted to a differential signal within the amplifier by single-to-differential converter 704. Also, inductor 706 connected to the source of transistor 122 does not have a center tap. In a single-ended amplifier, the matching networks operate in a manner substantially similar to the matching network in a differential amplifier.

A low noise amplifier in accordance with one or more embodiments provides an input impedance match for a source (e.g., for maximum power transfer) as well as amplifies the signal without adding too much noise or distortion, while consuming minimal power. By tuning a matching network between the source and the input of the LNA to reflect energy outside of a selected frequency sub-band, the selectivity of the LNA can be increased, and the noise in the amplifier can be decreased.

Although the invention is described herein with reference to specific embodiments, various modifications and changes can be made without departing from the scope of the present invention as set forth in the claims below. For example, while the techniques and apparatus for conjugately matching the input impedance of the LNA to the output impedance of the source may vary widely, one or more embodiments can be used in a wireless receiver, or other similar low-power signal amplifier. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method in a low-noise amplifier (LNA) comprising:
   selecting a selected sub-band for amplifying, wherein the selected sub-band is one of a plurality of sub-bands, wherein each sub-band is a portion of a frequency band, and wherein each sub-band has a corresponding sub-band center frequency;
   adjusting a gate-source capacitor so that a real part of an LNA input impedance corresponds to a real part of a source impedance at a selected sub-band center frequency corresponding to the selected sub-band; and
   adjusting a match capacitor so that the LNA input impedance corresponds to the complex conjugate of the source impedance at the sub-band center frequency.

2. The method in an LNA according to claim 1 wherein the adjusting the match capacitor comprises:
   selecting one or more match capacitor components from a plurality of match capacitor components to produce a selected combination of match capacitor components; and
   connecting the selected combination of match capacitor components.

3. The method in an LNA according to claim 1 wherein the match capacitor comprises a metal-insulator-metal (MIM) capacitor, and wherein the adjusting the match capacitor comprises:
   selecting one or more MIM match capacitor components from a plurality of MIM match capacitor components to produce a selected combination of MIM match capacitor components; and
   connecting the selected combination of MIM match capacitor components.

4. The method in an LNA according to claim 1 wherein the adjusting the gate-source capacitor comprises:
   selecting one or more gate-source capacitor components from a plurality of gate-source capacitor components to produce a selected combination of gate-source capacitor components; and
   connecting the selected combination of gate-source capacitor components.

5. The method in an LNA according to claim 1 wherein the LNA has an LNA Q factor, and wherein the LNA Q factor has a value greater than a Q factor needed to receive the frequency band with less than a predetermined input reflection coefficient.

6. The method in an LNA according to claim 1 wherein an input reflection coefficient curve of the LNA is less than a minimum input reflection coefficient over a frequency range at least equal to a center frequency step size, wherein the center frequency step size is a distance between adjacent sub-band center frequencies.

7. The method in an LNA according to claim 1 further comprising amplifying an input signal within the selected sub-band and rejecting an input signal outside the selected sub-band.

8. The method in an LNA according to claim 1 wherein the adjusting a gate-source capacitor and the adjusting a match capacitor comprises:
   recalling from memory a gate-source capacitor value associated with the selected sub-band;
   configuring an adjustable gate-source capacitor in response to the gate-source capacitor value associated with the selected sub-band;
   recalling from memory a match capacitor value associated with the selected sub-band; and
   configuring an adjustable match capacitor in response to the match capacitor value associated with the selected sub-band.

9. A low-noise amplifier (LNA) comprising:
   first and second LNA input terminals for coupling the LNA to a source having a source impedance, wherein the LNA has an LNA input impedance across the first and second LNA input terminals;
   a first transistor, of a first conductivity type, having a first gate electrode, a first source electrode, and a first drain electrode, wherein the first gate electrode is coupled to the first LNA input terminal;
   an adjustable gate-source capacitor coupled between the first gate electrode and the first source electrode;
   a source inductor coupled between the first source electrode and the second LNA input terminal;
   an adjustable match capacitor coupled between the first and second LNA input terminals;
   a match inductor coupled between the first and second LNA input terminals; and
   a controller coupled to the adjustable gate-source capacitor and the adjustable match capacitor, wherein the controller is responsive to a selected sub-band for amplifying, wherein the selected sub-band is one of a plurality of sub-bands, wherein each sub-band is a portion of a frequency band, and wherein each sub-band has a corresponding sub-band center frequency, and wherein the controller sets the adjustable gate-source capacitor so that a real part of the LNA input impedance corresponds to a real part of the source impedance at the selected sub-band center frequency, and wherein the controller sets the adjustable match capacitor so that the LNA input impedance is the complex conjugate of the source impedance at a selected sub-band center frequency corresponding to the selected sub-band.

10. The LNA of claim 9 wherein the adjustable gate-source capacitor comprises:
a plurality of gate-source capacitor components, wherein each gate-source capacitor component has a first terminal coupled to a first gate-source capacitor terminal; and
a plurality of gate-source capacitor switches, wherein each gate-source capacitor switch is coupled between a second terminal of the gate-source capacitor component and a second gate-source capacitor terminal, and wherein each of the plurality of gate-source capacitor switches is coupled to the controller for controlling a selection of one or more gate-source capacitor components coupled between the first and second gate-source capacitor terminals.

11. The LNA of claim 9 wherein the adjustable match capacitor comprises one or more voltage variable capacitors.

12. The LNA of claim 9 wherein the adjustable match capacitor comprises:
a plurality of first match capacitor components, wherein each first match capacitor component has a first terminal coupled to a first match capacitor terminal;
a plurality of second match capacitor components, wherein each second match capacitor component has a second terminal coupled to a second match capacitor terminal; and
a plurality of match capacitor switches, wherein each match capacitor switch is connected between a second terminal of a first match capacitor component and a first terminal of a second match capacitor component, and wherein each of the plurality of match capacitor switches is coupled to the controller for controlling a selection of one or more match capacitor components coupled between the first and second match capacitor terminals.

13. The LNA of claim 12 wherein the adjustable match capacitor comprises:
a plurality of first bias resistors, wherein each first bias resistor has a first terminal coupled to a second terminal of a first match capacitor component;
a plurality of second bias resistors, wherein each second bias resistor has a second terminal coupled to a first terminal of a second match capacitor component; and
a bias voltage source coupled to a second terminal of the plurality of first bias resistors and a first terminal of the plurality of second bias resistors.

14. The LNA of claim 9 further comprising a load coupled between a voltage source and the first drain electrode of the first transistor.

15. The LNA of claim 9 wherein the controller comprises a memory for storing configuration data associated with each of the plurality of sub-bands for configuring the adjustable gate-source capacitor, and for configuring the adjustable match capacitor.

16. A low-noise amplifier (LNA) comprising:
first and second LNA input terminals for coupling the LNA to a source having a source impedance, wherein the LNA has an LNA input impedance across the first and second LNA input terminals;
a first transistor, of a first conductivity type, having a first gate electrode, a first source electrode, and a first drain electrode, wherein the first gate electrode is coupled to the first LNA input terminal;
a second transistor, of a first conductivity type, having a second gate electrode, a second source electrode, and a second drain electrode, wherein the second gate electrode is coupled to the second LNA input terminal;
a first adjustable gate-source capacitor coupled between the first gate electrode and the first source electrode;
a second adjustable gate-source capacitor coupled between the second gate electrode and the second source electrode;
a source inductor coupled between the first source electrode and the second source electrode;
an adjustable match capacitor coupled between the first and second LNA input terminals;
a match inductor coupled between the first and second LNA input terminals; and
a controller coupled to the first and second adjustable gate-source capacitors and to the adjustable match capacitor, wherein the controller is responsive to a selected sub-band for amplifying, wherein the selected sub-band is one of a plurality of sub-bands, wherein each sub-band is a portion of a frequency band, and wherein each sub-band has a corresponding sub-band center frequency, and wherein the controller sets the first and second adjustable gate-source capacitors so that a real part of the LNA input impedance corresponds to a real part of the source impedance at the selected sub-band center frequency, and wherein the controller sets the adjustable match capacitor so that the LNA input impedance is the complex conjugate of the source impedance at a selected sub-band center frequency corresponding to the selected sub-band.

17. The LNA of claim 16 wherein the first and second adjustable gate-source capacitors each comprise:
a plurality of gate-source capacitor components, wherein each gate-source capacitor component has a first terminal coupled to a first gate-source capacitor terminal; and
a plurality of gate-source capacitor switches, wherein each gate-source capacitor switch is coupled between a second terminal of the gate-source capacitor component and a second gate-source capacitor terminal, and wherein each of the plurality of gate-source capacitor switches is coupled to the controller for controlling a selection of one or more gate-source capacitor components coupled between the first and second gate-source capacitor terminals.

18. The LNA of claim 16 wherein the adjustable match capacitor comprises one or more voltage variable capacitors.

19. The LNA of claim 16 wherein the adjustable match capacitor comprises:
a plurality of first match capacitor components, wherein each first match capacitor component has a first terminal coupled to a first match capacitor terminal;
a plurality of second match capacitor components, wherein each second match capacitor component has a second terminal coupled to a second match capacitor terminal; and
a plurality of match capacitor switches, wherein each match capacitor switch is connected between a second terminal of a first match capacitor component and a first terminal of a second match capacitor component, and wherein each of the plurality of match capacitor switches is coupled to the controller for controlling a selection of one or more match capacitor components coupled between the first and second match capacitor terminals.

20. The LNA of claim 19 wherein the adjustable match capacitor comprises:
- a plurality of first bias resistors, wherein each first bias resistor has a first terminal coupled to a second terminal of a first match capacitor component;
- a plurality of second bias resistors, wherein each second bias resistor has a second terminal coupled to a first terminal of a second match capacitor component; and
- a bias voltage source coupled to a second terminal of the plurality of first bias resistors and a first terminal of the plurality of second bias resistors.

21. The LNA of claim 16 further comprising a load coupled between a voltage source and the first drain electrode of the first transistor, and coupled between the voltage source and the second drain electrode of the second transistor.

22. The LNA of claim 16 wherein the controller comprises a memory for storing configuration data associated with each of the plurality of sub-bands for configuring the first and second adjustable gate-source capacitors, and for configuring the adjustable match capacitor.

* * * * *